(12) United States Patent
Ikeda et al.

(10) Patent No.: US 6,838,304 B2
(45) Date of Patent: Jan. 4, 2005

(54) MEMS ELEMENT MANUFACTURING METHOD

(75) Inventors: Koichi Ikeda, Kanagawa (JP); Takashi Kinoshita, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/468,757

(22) PCT Filed: Dec. 16, 2002

(86) PCT No.: PCT/JP02/13128

§ 371 (c)(1),
(2), (4) Date: Aug. 25, 2003

(87) PCT Pub. No.: WO03/055789

PCT Pub. Date: Jul. 10, 2003

(65) Prior Publication Data

US 2004/0077119 A1 Apr. 22, 2004

(30) Foreign Application Priority Data

Dec. 26, 2001 (JP) .................................... 2001-394881

(51) Int. Cl.⁷ .............................................. H01L 21/00
(52) U.S. Cl. .......................... 438/52; 438/50; 257/415
(58) Field of Search ............................ 438/48, 50, 52, 438/53, 425, 419; 257/414, 415, 417–419

(56) References Cited

U.S. PATENT DOCUMENTS

| | | | | |
|---|---|---|---|---|
| 5,578,976 A | * | 11/1996 | Yao | 333/262 |
| 5,605,614 A | * | 2/1997 | Bornand | 205/50 |
| 5,638,946 A | * | 6/1997 | Zavracky | 200/181 |
| 5,914,507 A | * | 6/1999 | Polla et al. | 257/254 |
| 6,016,092 A | * | 1/2000 | Qiu et al. | 333/262 |
| 6,396,368 B1 | * | 5/2002 | Chow et al. | 333/262 |
| 6,469,602 B2 | * | 10/2002 | Ruan et al. | 335/78 |
| 6,496,612 B1 | * | 12/2002 | Ruan et al. | 385/18 |
| 6,661,561 B2 | * | 12/2003 | Fitzpatrick et al. | 359/291 |

FOREIGN PATENT DOCUMENTS

| | | |
|---|---|---|
| JP | 3196823 B2 | 8/2001 |
| WO | WO-98/38801 A1 | 9/1998 |
| WO | WO-99/00991 A1 | 1/1999 |

* cited by examiner

*Primary Examiner*—Amir Zarabian
*Assistant Examiner*—Khanh Duong
(74) *Attorney, Agent, or Firm*—Ronald P. Kananen; Rader, Fishman & Grauer PLLC

(57) ABSTRACT

The present invention is directed to manufacturing methods of electrostatic type MEMS devices. The manufacturing method of the present invention includes the steps of forming a substrate side electrode on a substrate, forming a fluid film before or after forming a sacrificial layer, further forming a beam having a driving side electrode on a planarized surface of the fluid film, and finally, removing the sacrificial layer. Furthermore, performing the foregoing method planarizes the surface of a driving side electrode, reduces fluctuations in the shape of a beam, and improves the performance and the uniformity of the MEMS device.

2 Claims, 15 Drawing Sheets

MEMS ELEMENT MANUFACTURING METHOD

TECHNICAL FIELD

The present invention relates to manufacturing methods of an electrostatic drive type MEMS device.

BACKGROUND ART

With the advances in microscopic manufacturing technology, much attention has been focused on so-called micro-machine (MEMS: Micro Electro Mechanical Systems, ultra-miniature electric, mechanical compound) devices and miniature devices in which MEMS devices are incorporated.

A MEMS device is a device that is formed on a substrate such as a silicon substrate, glass substrate or the like as a microscopic structure, and electrically and further, mechanically unites a driving body outputting mechanical driving force with a semiconductor integrated circuit or the like that controls the mechanical body. A basic feature of the MEMS device is that a mechanically structured driving body is incorporated in a part of the device, and the driving body is electrically driven by the use of coulombic attraction force between electrodes or the like.

FIGS. 11 and 12 show a typical composition of an optical MEMS device that is applied to an optical switch and a light modulation device by taking advantage of the reflection or diffraction of light.

An optical MEMS device 1 shown in FIG. 11 includes a substrate 2, a substrate side electrode 3 formed on the substrate 2, a beam 6 having a driving side electrode 4 that is disposed in parallel to oppose the substrate side electrode 3, and a support part 7 for supporting one end of the beam 6. The beam 6 and substrate side electrode 3 are electrically insulated by a void 8 therebetween.

A required substrate such as a substrate with an insulation film formed on a semiconductor substrate of, for example, silicon (Si), gallium arsenic (GaAs) and the like, or an insulative substrate such as a glass substrate is used for the substrate 2. The substrate side electrode 3 is formed of a polycrystalline silicon film by doping impurities therein, metal film (W deposited film, for example), and the like. The beam 6 is composed of, for example, an insulation film 5 such as silicon nitride film (SiN film) or the like and the driving side film 4 serving as a reflective film consisting of, for example, Al film of 100 nm or so in thickness. The beam 6 is formed in a so-called cantilever fashion with its one end supported by the support part 7.

In the optical MEMS device 1, the beam 6 displaces itself in response to electrostatic attraction force or electrostatic repulsion force generated between the substrate side electrode 3 and driving side electrode 4 by an electric potential applied to the substrate side electrode 3 and driving side electrode 4, and as shown by a solid line as well as a broken line in FIG. 11, for example, the beam 6 displaces itself into a parallel state or inclined state relative to the substrate side electrode 3.

An optical MEMS device 11 shown in FIG. 12 is composed of a substrate 12, a substrate side electrode 13 formed on the substrate 12 and a beam 14 that straddles the substrate side electrode 13 in a bridge-like fashion. The beam 14 and substrate side electrode 13 are insulated by a void 10 therebetween.

The beam 14 is composed of a bridge member 15 of, for example, a SiN film that rises up from the substrate 12 and straddles a substrate side electrode 13 in a bridge-like fashion and a driving side electrode 16 of, for example, an Al film of 100 nm or so in thickness, that, serving as a refection film, is provided on the bridge member 15 to oppose the substrate side electrode 13 in parallel to each other. The substrate 12, substrate side electrode 13, beam 14 and the like may employ similar compositions and materials to those explained in FIG. 11. The beam 14 is formed in a so-called bridge-like fashion in which the both ends thereof are supported.

In the optical MEMS device 11, the beam 14 displaces itself in response to electrostatic attraction force or electrostatic repulsion force generated between the substrate side electrode 13 and driving side electrode 16 by an electric potential that is applied to the substrate side electrode 13 and driving side electrode 16, and as shown by a solid line and a broken line as well in FIG. 12, for example, the beam 14 displaces itself into a parallel state or fallen state relative to the substrate side electrode 13.

With these optical MEMS devices 1, 11, light is irradiated on the surfaces of the driving side electrodes 4, 16 serving as a light reflective film, and by taking advantage of differences in the direction of reflected light depending on positions into which the beam 6, 14 are driven, these MEMS devices can be applied to an optical switch having a switch function by detecting the reflected light of one direction.

Further, the optical MEMS devices 1, 11 are applicable as a light modulation device for modulating the strength of light. When light reflection is taken advantage of, the strength of light is modulated by vibrating the beams 6, 14 according to the amount of reflected light of one direction per unit time. This light modulation device runs on a so-called time modulation.

When light diffraction is taken advantage of, a light modulation device is composed of a plurality of beams 6, 14 disposed in parallel relative to the common substrate side electrodes 3, 13, and by varying the height of, for example, driving side electrodes serving as a light reflective film with the movements of every other beam 6, 14 such as moving closer to or moving away from the common substrate side electrodes 3, 13, the strength of reflected light from the driving side electrodes is modulated by means of light diffraction. This light modulation device runs on a so-called space modulation.

FIG. 13 shows a composition of the GLV (Grating Light Valve) device developed by SLM (Silicon Light Machines) as a light strength modulation device for a laser display, that is, light modulator.

In a GLV device 21, as shown in FIG. 13A, a common substrate side electrode 23 of a refractory metal, for example, a tungsten thin film or a nitride film thereof, or of a poly-crystalline silicon thin film is formed on an insulation substrate 22 such as a glass substrate 22 or the like, and a plurality of beams 24, in this example, six beams [$24_1$, $24_2$, $24_3$, $24_4$, $24_5$, $24_6$] straddling across the substrate side electrodes 23 in a bridge-like fashion are disposed in parallel. The compositions of the substrate side electrode 23 and beams 24 are the same as those explained in FIG. 11. Namely, as shown in FIG. 13B, a reflective film cum driving side electrode 26 of an Al film of 100 nm or so in thickness is formed on the surface, which is in parallel to the substrate side electrode 23, of a bridge member 25 of a SiN film, for example.

The beam 24 composed of the bridge member 25 and reflective film cum driving side electrode 26 provided thereon is a portion conventionally called a ribbon.

The aluminum film (Al film) used as the reflective film cum driving side electrode 26 is a suitable metal as the material for optical components because of the following reasons: (1) it is a metal that can be comparatively easily formed into a film; (2) the dispersion of reflectance with respect to wavelengths in a visible light range is small; (3) alumina natural oxidation film generated on the surface of the Al film functions as a protective film to protect a reflective surface.

Further, the SiN film (silicon nitride film) composing the bridge member 25 is formed by the use of the low-pressure CVD method, and the SiN film is selected by reason of the physical values of its strength, elasticity constant, and the like being suitable for mechanically driving the bridge member 25.

When a small voltage is applied between the substrate side electrode 23 and reflective film cum driving side electrode 26, the above-mentioned beam 24 moves closer to the substrate side electrode 23 according to the above-mentioned electrostatic phenomenon, and when the application of the voltage is stopped, the beam 24 moves away from the substrate side electrode 23 and returns to an original position.

The GLV device 21 alternately varies the height of the reflective film cum driving side electrode 26 with the movements of the plurality of beams 24 such as moving closer to or moving away from the substrate side electrode 23 (that is, those movements of every other beams), and modulates the strength of light reflected on the driving side electrode 26 by means of the diffraction of light (one beam spot is irradiated on the whole of six beams 24).

Mechanical characteristics of the beam driven by taking advantage of electrostatic attraction force and electrostatic repulsion force are almost predicated on the physical properties of the SiN film formed by the use of the CVD method or the like, with an Al film mainly functioning as a mirror.

By the way, as described above, the substrate side electrode in the MEMS device is formed on an insulation layer of a semiconductor substrate made of silicon, GaAs, or the like, or an insulative substrate such as a glass substrate. As for materials of the electrode, a polycrystalline silicon film or metal film, in which impurities are doped is used. However, since these materials have a crystalline structure, there occurs unevenness on the surface thereof. For example, in the case of a polycrystalline silicon electrode, according to an analysis by AFM (an atomic force microscope), controlling relative roughness RMS (root mean square) value of a surface can be achieved by strictly carrying out temperature control in the manufacturing process, and it is a well known fact that there easily occurs surface relative roughness of 20 nm or more after a conventional film forming process and a semiconductor manufacturing process that have so far been practiced. The degree of the roughness depends on materials and film forming methods as well.

This surface unevenness poses not so serious a problem in terms of the electric characteristics as well as the operating characteristics of the MEMS device, though it often has become problems in the manufacturing process of an optical MEMS device. Namely, the substrate side electrode of the above-mentioned MEMS device is usually positioned under the reflective film cum driving side electrode. In this case, surface unevenness of a lower layer film becomes sequentially transcribed to an upper layer film in the manufacturing process, thereby resulting in the forming of a driving side electrode with piled-up transcribed surface unevenness, that is, the forming of a reflective film therewith on the uppermost layer that is an optically important film surface.

As one of the manufacturing methods of the MEMS device, there is a method in which a multi-layer structure is formed by repeatedly laminating and processing thin films, and thereafter by selectively removing one layer of the multi-layer structure to manufacture a so-called hollow structure that has a void between a substrate side electrode and beam. This manufacturing method is shown in FIGS. 14A to 14D. This example is the case of being applied to manufacturing the above-mentioned MEMS device 1 shown in FIG. 11.

First, as shown in FIG. 14A, the substrate side electrode 3 of, for example, a polycrystalline silicon film is formed on a substrate 2 in which an insulation film 10 such as $SiO_2$ film or the like is formed on the upper surface of, for example, a silicon substrate 9, and after forming a support part 7, a sacrificial layer 18 for forming a void is formed on a surface including the substrate side electrode 3. Next, as shown in FIG. 14B, for example, a silicon nitride (SiN) film 5 and a driving side electrode material layer of, for example, an aluminum (Al) film 4' constituting a beam are formed on the support part 7 and sacrificial layer 18. Next, as shown in FIG. 14C, the silicon nitride film 5 and aluminum film 4' are subjected to patterning through a resist mask 19 to thereby form a beam 6 composed of the silicon nitride film 5 and a driving side electrode 4 made of aluminum. Thereafter, as shown in FIG. 14D, by removing the sacrificial layer 18 to form a void 8 between the substrate side electrode 3 and beam 6, the MEMS device 1 is manufactured.

Silicon (for example, non-crystalline silicon, polycrystalline silicon, or the like) or a silicon oxide film is used to form the sacrificial layer 18. When the sacrificial layer 18 is made of silicon, it can be removed by, for example, a mixture of nitric acid and fluoric acid, or by gas etching employing gas which contains fluorine (F). And when the sacrificial layer 18 is made of an oxidized layer, it is conventionally removed by an oxygen fluoride solution, or by plasma etching employing fluorinated carbon gas.

With such optical MEMS device as manufactured to have a three-layer structure of a substrate side electrode (a), a sacrificial layer (b) for forming a void, and a reflective film cum driving side electrode (c), assuming that the maximum values of surface unevenness that are observed in each of the respective layers are $R_{max}$ (a), $R_{max}$ (b), $R_{max}$ (c), there is a possibility that when the three layers are laminated, the amount of surface unevenness on the surface of the uppermost layer adds up to the sum of these maximum values.

Describing the performance of optical components of the MEMS device in which aluminum (Al) is made to serve as a reflective film, 92% of the reflectance of the Al film may possibly be obtained if the film is a bulk Al film. However, if there is no controlling on the amount of this surface unevenness, the reflectance will deteriorate by more than several percentage points, so that only 85% or so thereof can barely be obtained. In an extreme case, it is observed that the surface appears to be clouded up. With such an optical MEMS device, as shown in FIG. 15, (an enlarged view of the relevant part of a driving portion), for example, when the substrate side electrode 3 is formed of polycrystalline silicon, unevenness on the surface of the polycrystalline silicon film increases and is transcribed onto the surface of the driving side electrode (Al film) 4 composing the beam (an Al/SiN laminated film) 6, resulting in the deterioration of light reflectance of the driving side electrode serving as a mirror.

Further, there remains a design problem. A MEMS transducer, that is, the resonant frequency of a beam is usually designed by taking account of the mass of resonance, the tensile force of films in respective regions that support the driving part and the like, though in the present circumstances at a time of designing the values of physicality of the respective films are conventionally computed and designed by using the values of physicality on the assumption that those films are in an ideal thin state. Then, as shown in FIG. 16, for example, in case there exists a semi-sphere of 0.3 μm in the substrate side electrode 3, when the sacrificial layer 18 of 0.5 μm is formed on the substrate side electrode 3, there is formed a semi-sphere b of 1.3 μm in diameter by isotropic film forming; and when the beam 6 is formed thereupon, the surface unevenness of the beam 6 further increases.

When the beam is sufficiently thick in comparison with this 1.3 μm, the unevenness is observed as that inherent in the beam 6. However, when the film thickness of the beam becomes thinner, the own shape of the beam 6 is transformed, and the beam 6 is observed to have, for example, a folded structure (referring to FIG. 17). At this time, there occurs the problem that the MEMS device is unable to have dynamic characteristics in accordance with design. FIG. 18 shows an example thereof. In the case where the tensile force of the beam 6 is taken advantage of to drive the MEMS device, if the beam 6 having the film shape is pulled by both ends using the tensile force, its accordion structure stretches out, resulting in wild fluctuations of the physicality value that is approximated by a spring.

As explained above, the surface unevenness of the substrate side electrode has not only affected the relative roughness of the surface of the beam, but also been a factor in the fluctuations of parameters inherent in the MEMS device such as resonance frequency and the like.

DISCLOSURE OF THE INVENTION

The present invention provides a manufacturing method of a MEMS device, in which the surface of a beam is made to be planarized, fluctuations in the shape of the beam is reduced, thereby improving the performance and uniformity in the performance as well.

A manufacturing method of a MEMS device according to the present invention has the steps of: forming a substrate side electrode on a substrate, forming a fluid film on the substrate side electrode, forming a sacrificial layer on a planarized surface of the fluid film, forming on the sacrificial layer a beam having a driving side electrode, and removing the sacrificial layer.

A manufacturing method of a MEMS device according to the present invention has the steps of: forming a substrate side electrode on a substrate, forming a sacrificial layer on the substrate side electrode through a protective film, or not through the protective film, forming a fluid film on the sacrificial layer, forming a beam having a driving side electrode on a planarized surface of the fluid film, and removing the sacrificial layer.

As the fluid film mentioned above, a silicate glass film whose covering form of a step is fluid form can be employed. The silicate glass film is formed of phosphor, boron, or formed containing the both, and after forming the silicate glass film, heat treatment is applied thereto, and the surface of the above-mentioned silicate glass can be planarized.

The silicate glass film is formed of a silicon oxide film by means of the CVD method wherein ozone and alkoxysilane are used as materials.

According to a manufacturing method of a MEMS device of the present invention, since a substrate side electrode is formed on a substrate, and then a fluid film is formed on the substrate side electrode, followed by sequentially forming a sacrificial layer and a beam on the planarized surface of the fluid film, the surface of the beam becomes planarized without unevenness. Since the sacrificial layer is removed thereafter, the beam having a driving side electrode with the planarized surface can be formed with a required void against the substrate side electrode.

Further, according to another manufacturing method of a MEMS device of the present invention, since a substrate side electrode is formed on a substrate, and then a sacrificial layer is formed on the substrate side electrode through a protective film or not through the protective film, followed by forming a fluid film on the sacrificial layer to form a beam on the planarized surface of the fluid film, the surface of the beam becomes planarized without unevenness. Since the sacrificial layer is removed thereafter, the beam having a driving side electrode with the planarized surface can be formed with a required void against the substrate side electrode.

According to the above-mentioned manufacturing method of the MEMS device of the present invention, since a fluid film is formed before or after a sacrificial layer is formed, followed by forming an insulation film and driving side electrode composing a beam on the planarized film by the fluidization of the fluid film, the surface of which is ultimately planarized can be formed. Therefore, uniformity of the film composing the beam is obtained to reduce the fluctuations in the shape of the film, and the physicality value of the beam is not largely fluctuated. In addition, since unevenness on the surface of the beam can be planarized and fluctuations in the vibratory characteristics of the beam can be reduced as well, uniformity in the performance of the MEMS device can be improved and the high-quality MEMS device can be manufactured on a large scale. When the MEMS device which is manufactured according to the manufacturing method of the present invention is applied to an optical MEMS device that is used for, for example, an optical switch or a light modulation device and the like using the light reflectance or light diffraction, the light reflectance of the driving side electrode serving as a light reflective film improves, and light use efficiency as an optical MEMS device can be improved as well.

BEST MODES FOR CARRYING OUT THE INVENTION

Hereinafter, embodiments of the present invention will be explained with reference to drawings.

FIGS. 1 to 3 show one embodiment of a manufacturing method of a MEMS device according to the present invention. This embodiment is the case in which the present invention is applied to manufacturing a typical electrostatic drive type MEMS device.

Figure 1A:
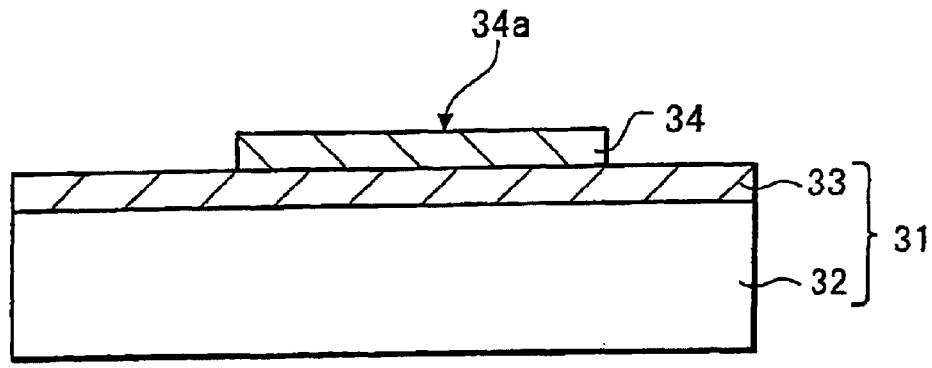
FIGS. 1A to 1C are diagrams of a manufacturing process (first sequence) showing one embodiment of a manufacturing method of one typical electrostatic drive type MEMS device according to the present invention.
Figure 3A:
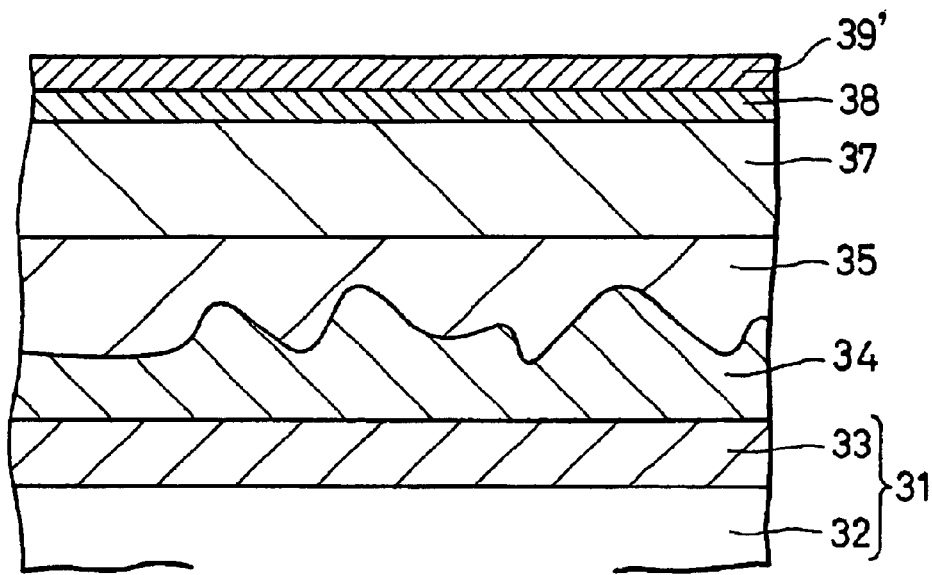
FIG. 3A is an enlarged cross-sectional view of a relevant part of FIG. 2A.

First, as shown in FIG. 1A, a substrate side electrode 34 is formed on a substrate, in this embodiment, a substrate 31 in which an insulation film 33 is formed on a semiconductor substrate 32. The semiconductor substrate 32 can be formed of, for example, a silicon (Si) substrate, gallium arsenic (GaAs) substrate or the like, and the insulation film 33 can be formed of a silicon oxide ($SiO_2$) film, silicon nitride (SiN) film or the like. The substrate side electrode 34 can be formed of a polycrystalline silicon film, metal film or the like, into which impurities are doped, and in this embodiment, formed of an impurities-doped polycrystalline silicon film. A surface 34a of the substrate side electrode 34 formed of the polycrystalline silicon film has, as shown in FIG. 3A, considerable unevenness.

Figure 1B:
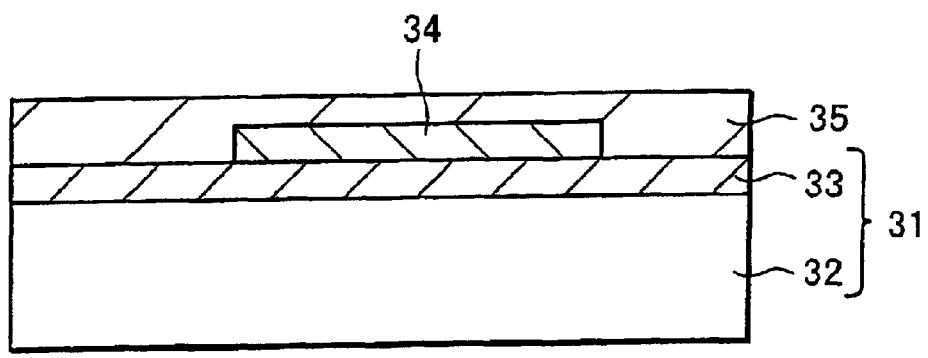

Next, as shown in FIG. 1B, a fluid film 35, the surface of which is planarized by fluidization, is formed on the overall surface including the surface of the substrate side 34.

This fluid film 35 can be formed in the following manner.

As the fluid film 35, for example, a phosphor-doped or boron-doped, or the both-doped (phosphor and boron) silicon oxide film, so-called PSG (phosphor silicate glass), BSG (boron silicate glass), or PBSG (phosphor boron silicate glass) film is formed by the CVD (Chemical Vapor Deposition) method. Concentrations of the phosphor and boron to be doped can respectively be made approximately 7% by weight, and the above-mentioned silicate glass film doped with either of them or both of them can be used. After the fluid film 35 composed of the impurities-doped silicate glass is formed, anneal treatment at 750° C. or more is performed to fluidize the fluid film 35, and the surface thereof is planarized. The CVD method is carried out employing chemical vapor deposition of a hot wall type in which a silane gas 50 cc/Min. and $N_2O$ gas 100 cc/Min. are used as reactive gas. $PH_3$ is used as a material for doping phosphor, and $B_2H_6$ is used as a material for doping boron. The anneal treatment can be carried out in the atmosphere of, for example, a nitride gas at 850° C. for thirty minutes.

As for another embodiment, a silicate glass film constituting the fluid film 35 can be formed of a silicon oxide film by the CVD method in which ozone and alkoxysilane are used as materials. For example, the silicon oxide film is formed by the normal-pressure CVD method in which, for example, TEOS (tetraethoxysilane) and ozone are used as materials. As the conditions for forming a film, the quantity of flow of TEOS is set to approximately 40 cc/min. and that of ozone is set to approximately 350 cc/min.; oxygen and diluted nitride are used to transport the ozone; and the substrate temperature is set at about 350° C. With the CVD method in which TEOS and ozone are used as materials, a film is formed as fluidization is being maintained, and when the fluid film 35 is formed, the surface thereof has been already planarized. This silicate glass film can be formed of either a non-doped film or an impurities-doped film (for example, BSG film, PSG film). As a characteristic of the CVD using TEOS/ozone, it is noted that a similar fluid form to those of the above-mentioned BSG film, PSG film and BPSG film is obtained when a step on the substrate are covered thereby. In this embodiment, a formed non-doped dioxide silicon film also planarizes unevenness on the surface of the substrate side electrode 23 to provide an extremely planarized and smooth surface. In terms of other physicality and film characteristics, there is no obvious difference between the above-mentioned impurities-doped silicate film and ozone TEOS CVD oxide film, and a required MEMS device to be mentioned later on can be obtained by either of the manufacturing method. Although TEOS is used in this embodiment, other alkoxysilane such as tetramethoxysilane, tetraisopropoxysilane, and the like may be used. Meanwhile, since it becomes difficult to obtain a fluid form as the number of carbons of alkoxysilane increases, a thicker film is needed in order to obtain a required surface smoothness. Further, material including fluorine such as triethoxysilane fluoride [$(C_2H_5O)\,3CF$] and the like may be used. In that case, a similar result is also obtained, and further, since a formed film includes fluorine, there occurs added value that enables low dielectric constant film to be obtained, thereby contributing to improving the characteristic of the MEMS device.

Figure 1C:
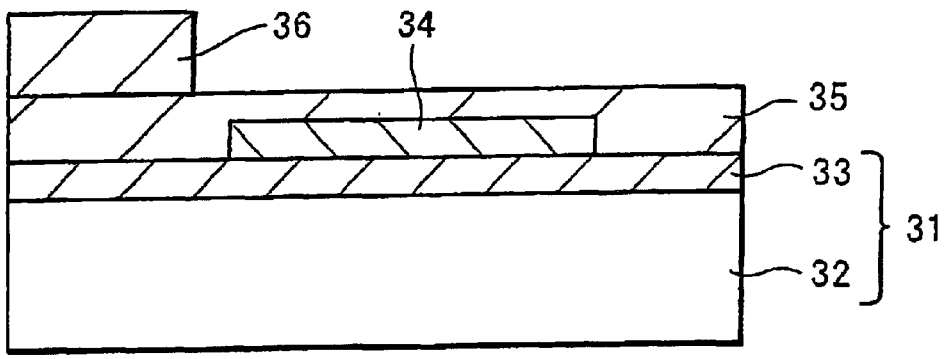

Next, as shown in FIG. 1C, an insulation film that becomes a support part, such as a silicon nitride (SiN) film, silicon oxide ($SiO_2$) film and the like, in this embodiment, silicon nitride film is formed on the surface of the fluid film 35 by the CVD method or the like, and patterning is applied thereto to form a support part 36 of the silicon nitride film at a position detached from the substrate side electrode 34.

Figure 2A:
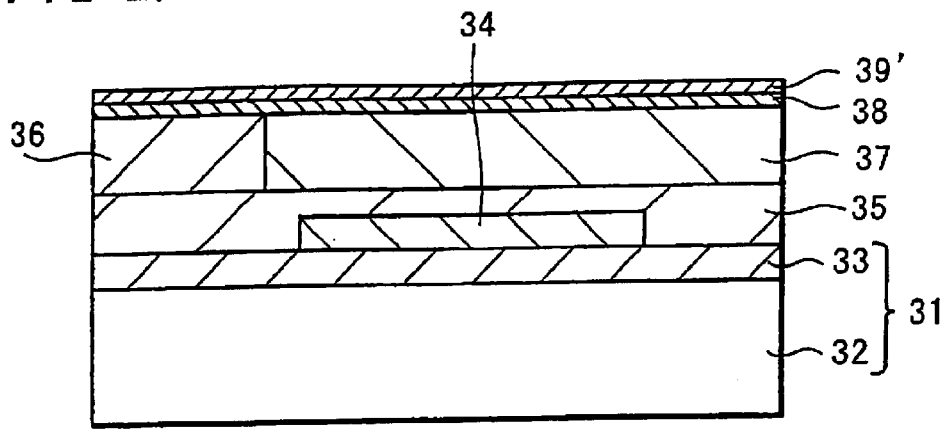
FIGS. 2A to 2C are diagrams of a manufacturing process (second sequence) showing one embodiment of the manufacturing method of one typical electrostatic drive type MEMS device according to the present invention.

Next, as shown in FIG. 2A, a sacrificial layer 37 for forming a void, in this embodiment, non-crystalline silicon layer is formed over the overall surface of the fluid layer 35, followed by etching the non-crystalline silicon layer 37 so that the surface becomes flush with the surface of the support part 36. Further, as the sacrificial layer 37, other than a non-crystalline film, polycrystalline silicon film, photoresist film or insulating film (for example, silicon oxide film, silicon nitride film) and the like that are different in etching rate from an insulation film that composes the support part 36 and a beam as described later on can be used. For the purpose of improving the performance of the MEMS device, however, it is necessary to carefully select the kind of film while controlling the growth in diameter of grains of the film itself used as a sacrificial layer, otherwise the effectiveness of the lower electrode/fluid film whose surfaces have been planarized may disappear.

Next, an insulation film of, for example, silicon nitride film, silicon oxide film or the like, in this embodiment, silicon nitride film 38 is formed on the overall surface including the surface of the support part 36 and that of the non-crystalline silicon layer 37 serving as a sacrificial layer, followed by forming thereupon a driving side electrode material layer 39' of, in this embodiment, an Al material layer. FIG. 3A shows enlarged relevant part thereof. As the driving side electrode material layer, a silver Ag film, an Al film mainly consisting of aluminum (Al) as components, a refractory metal film formed of such as titanium Ti, tungsten W, molybdenum Mo, tantalum Ta, or the like can be used.

Figure 2B:
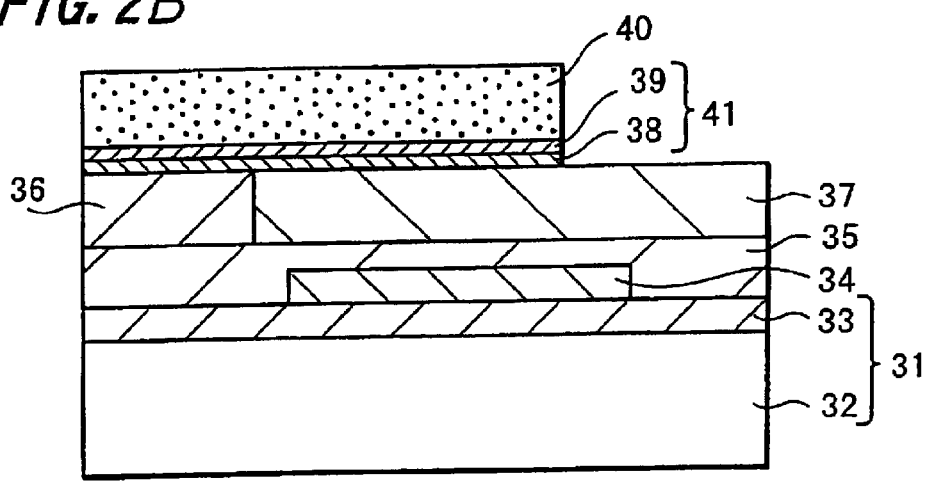

Next, as shown in FIG. 2B, a resist mask 40 is formed, and a driving side electrode material layer 39' and silicon nitride film thereunder are selectively removed by etching through the resist mask 40 so as to form a beam 41 composed of a driving side electrode (Al electrode) 39 and silicon nitride film 38, which is supported by the support part 36.

Figure 2C:
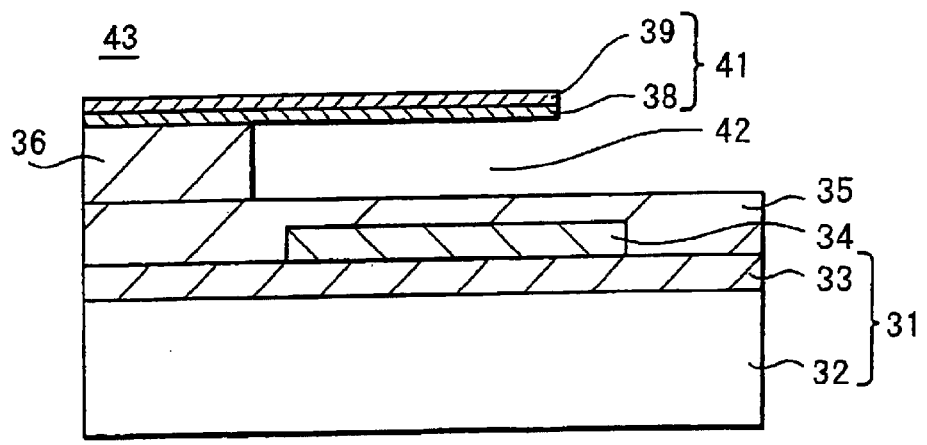
Figure 3B:
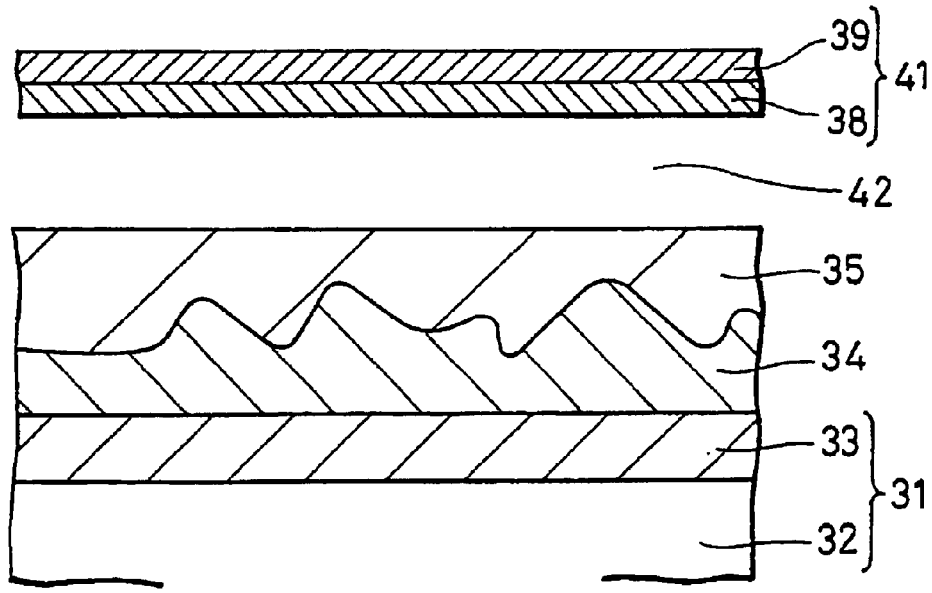
FIG. 3B is an enlarged cross-sectional view of a relevant part of FIG. 2C.

Next, as shown in FIG. 2C, the non-crystalline silicon film 37 constituting a sacrificial layer is removed by gas etching with, for example, $XeF_2$ gas to form a void 42 between the substrate side electrode 34 (substantially, fluid film 35) and beam 41, and as a result, a targeted electrostatic drive type MEMS device 43 having a structure of a cantilever fashion can be obtained. FIG. 3B shows an enlarged relevant part thereof including the beam 41.

This MEMS device 43 is such composed as to have the fluid film 35, which has a planarized surface and serves as a protective film, on the considerably uneven surface of the substrate side electrode 34, and to have the beam 41 that is detached from the fluid film 35 with the required void 42 therebetween and has a planarized surface and a planarized reverse surface opposing the fluid film.

According to the manufacturing method of this embodiment, after forming the substrate side electrode 34 of polycrystalline silicon, the fluid film 35 is formed; and the sacrificial layer 37, silicon nitride film 38 and driving side electrode material layer 39' that compose a beam are sequentially formed on the fluid layer 35 with its surface 35a having been planarized, so that the surfaces of the sacrificial layer 37, the silicon nitride film 38, and the driving side electrode material layer 39' are planarized, and as a result, the beam 41 with its surface ultimately being planarized can be formed. Namely, when the driving side electrode 39 is formed of an Al film, for example, the surface of the Al film reflects only the unevenness of crystallized grains of the Al film. Consequently, as shown in 3B, the beam 41 having favorable flatness can be formed.

Therefore, the uniformity of the film of the beam 41 can be obtained, the fluctuations in the film shape of the beam can be reduced, and there are no considerable fluctuations in the physicality value of the beam, with the result that it is possible to obtain the MEMS device, in which the whole film of the beam is without any fluctuation.

Further, since it is possible to get rid of the unevenness of the surface of the beam 41 and reduce the fluctuations in the number of vibration and the like of the beam 41, uniformity in the performance of the MEMS device can be improved, and the mass-production of the high-quality MEMS device 43 is made possible.

When the MEMS device 43 manufactured according to the embodiment is applied to the optical MEMS devices used in, for example, an optical switch, a light modulation device or the like that takes advantage of light reflection or light diffraction, light reflectance on the driving side electrode 39 serving as a light reflective film can be improved, and the improvement of light use efficiency as the optical MEMS device can be implemented.

Figure 4A:
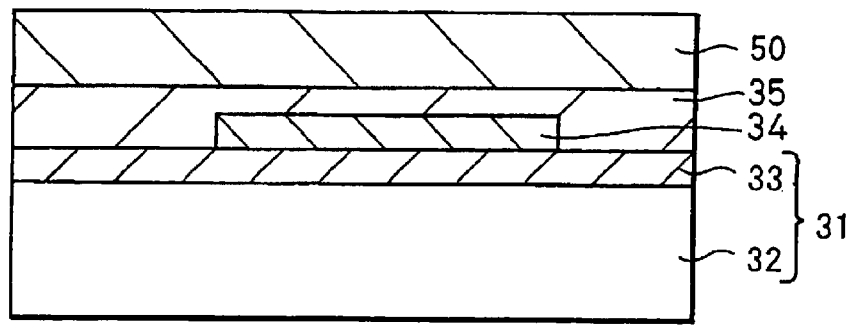
FIGS. 4A to 4C are diagrams of a manufacturing process (first sequence) showing another embodiment of a manufacturing method of one typical electrostatic drive type MEMS device according to the present invention.

While in the above-mentioned embodiment the support part 36 is formed by patterning, further with respect to a method of forming this support part, another embodiment will be described. FIGS. 4 and 5 show another embodiment of the manufacturing method of the MEMS device according to the present invention.

First, the same as in FIG. 1B, as shown in 4A, the patterned substrate side electrode 34 is formed on the substrate 31 consisting of the insulation film 33 formed on the semiconductor substrate 32, for example, and the fluid film 35 is formed on the substrate side electrode 34. Next, for example, the non-crystalline silicon film 50 serving as the sacrificial layer is formed on the overall surface of the planarized substrate.

Figure 4B:
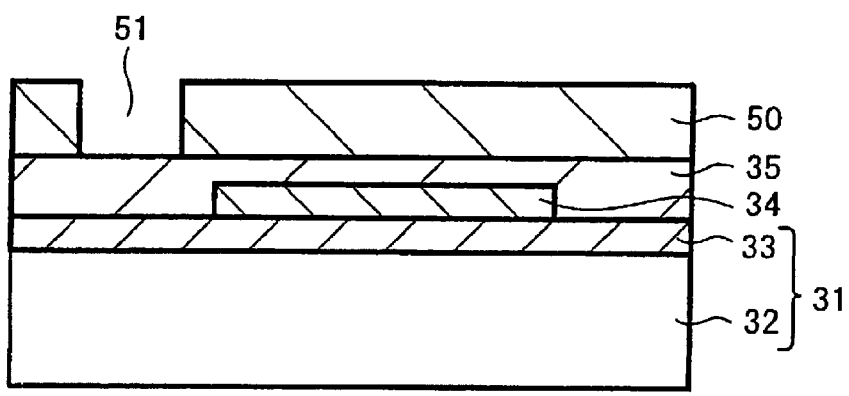

Next, as shown in FIG. 4B, an opening 51 is formed at a predetermined position of the non-crystalline silicon film 50, that is, at a portion corresponding to a support part (columnar support: post) for supporting the beam which is formed later on.

Figure 4C:
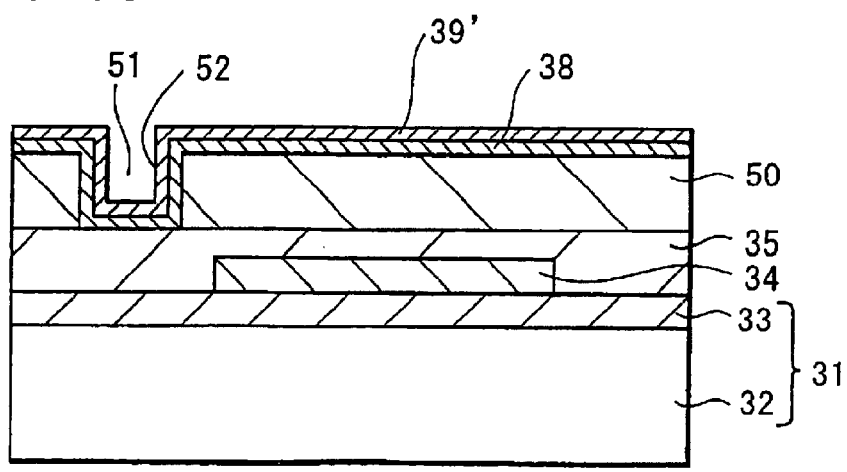

Next, as shown in FIG. 4C, an Al/SiN laminated film consisting of the insulation film (for example, silicon nitride film) 38 and driving side electrode material layer (for example, Al material) 39' is formed over the non-crystalline silicon film 50 including the inside of the opening 51. Here, the AL/SiN laminated film formed on the side walls of the opening 51 becomes a support part 52 for supporting the beam, that is, a post of cylinder or square column in shape with its core hollowing out.

Figure 5A:
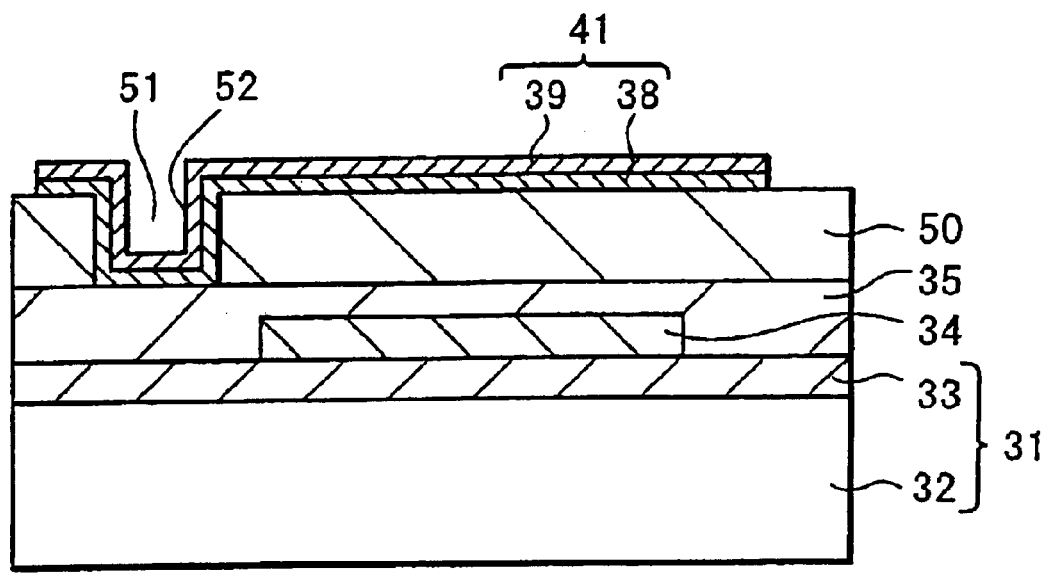
FIGS. 5A to 5B are diagrams of a manufacturing process (second sequence) showing another embodiment of the manufacturing method of one typical electrostatic drive type MEMS device according to the present invention.
Figure 5B:
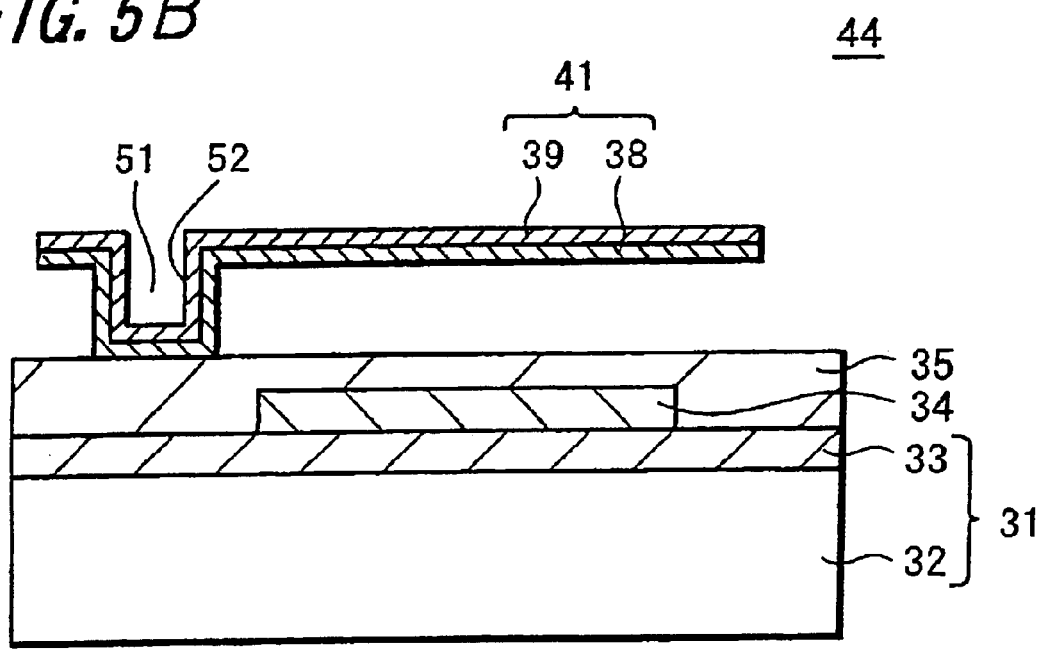

Next, as shown in FIG. 5A, by patterning the Al/SiN laminated film composed of the silicon nitride film 38 and non-crystalline film 39', there is formed the beam 41 composed of the silicon nitride 38 and driving side electrode 39 thereupon. Next, the non-crystalline film constituting a sacrificial layer is removed to obtain the targeted MEMS device 44, as shown in FIG. 5B. In FIG. 5B, since the beam 41 is elongated in one direction from the support part 52, the MEMS device in a so-called cantilever fashion can be obtained.

As with this embodiment, similar effectiveness to those of the above-mentioned manufacturing method shown in FIGS. 1 to 3 can be obtained. Further, the MEMS device 44 manufactured according to this embodiment is favorably applied to the optical MEMS device used for, for example, the optical switch, light modulation device and the like as is the above-mentioned MEMS device 43.

FIGS. 6 to 8 show another embodiment of the manufacturing method of the MEMS device according to the present invention. This embodiment is also a method that is applied to manufacturing the typical electrostatic drive type MEMS device with its beam in the same cantilever fashion as mentioned above.

Figure 6A:
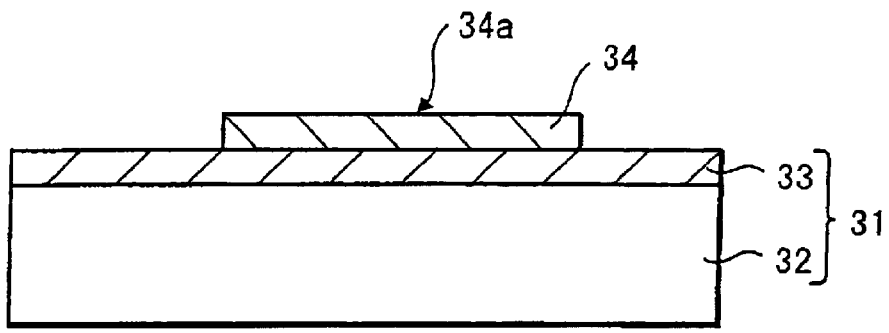
FIGS. 6A to 6C are diagrams of a manufacturing process (first sequence) showing further another embodiment of a manufacturing method of one typical electrostatic drive type MEMS device according to the present invention.
Figure 8A:
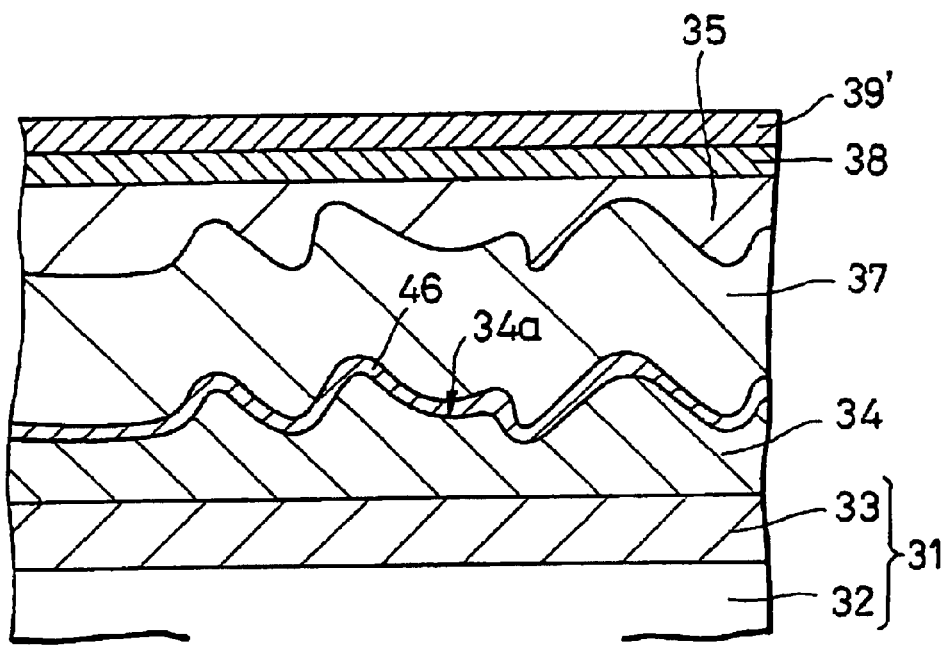
FIG. 8A is an enlarged cross-sectional view of a relevant part of FIG. 4C.

First, as shown in FIG. 6A, the substrate side electrode 34 is formed on a substrate, in this embodiment, the substrate 31 consisting of the insulation film 33 such as silicon oxide ($SiO_2$) film formed on the silicon semiconductor substrate 32. The substrate side electrode 34 can be formed of polycrystalline silicon film, metal film or the like, into which impurities are doped, and in this embodiment, the impurities-doped polycrystalline film is employed. As shown in FIG. 8A, a surface 34a of the substrate side electrode 34 of the polycrystalline silicon film has considerable unevenness.

Figure 6B:
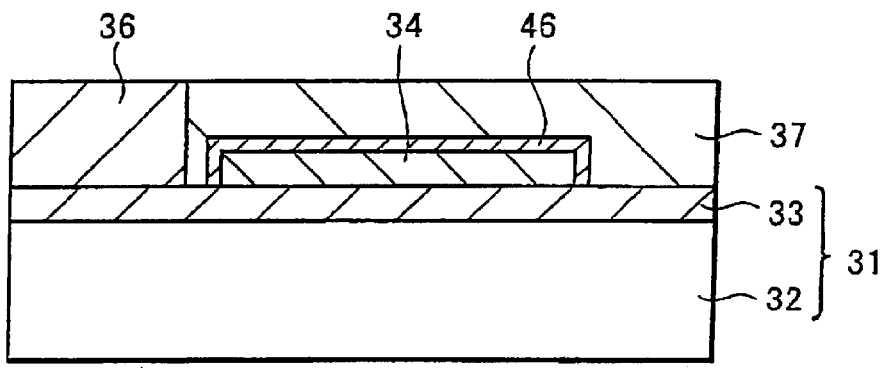

Next, as shown in FIG. 6B, after forming a protective film, in this embodiment, silicon oxide ($SiO_2$) film 46 on the surface of the substrate side electrode 34, an insulation film serving as a support part, such as a silicon nitride (SiN) film, silicon oxide ($SiO_2$) film, or the like, in this embodiment, silicon nitride film is formed by the CVD method or the like, followed by patterning the silicon nitride film to form the support part 36 of the silicon nitride film at a position detached from the substrate side electrode 34.

Next, a sacrificial layer 37 for forming a void, in this embodiment, polycrystalline silicon layer is formed, followed by etching the polycrystalline silicon layer 37 to become flush with the support part 36. Meanwhile, as the sacrificial layer 37, similarly to the embodiments mentioned above, other than a polycrystalline film, a non-crystalline silicon film, photoresist film, insulation film (for example, silicon oxide film, silicon nitride film or the like) that is different in etching rate from an insulation film constituting the support part 36 and a beam mentioned later on, or the like can be used.

Figure 6C:
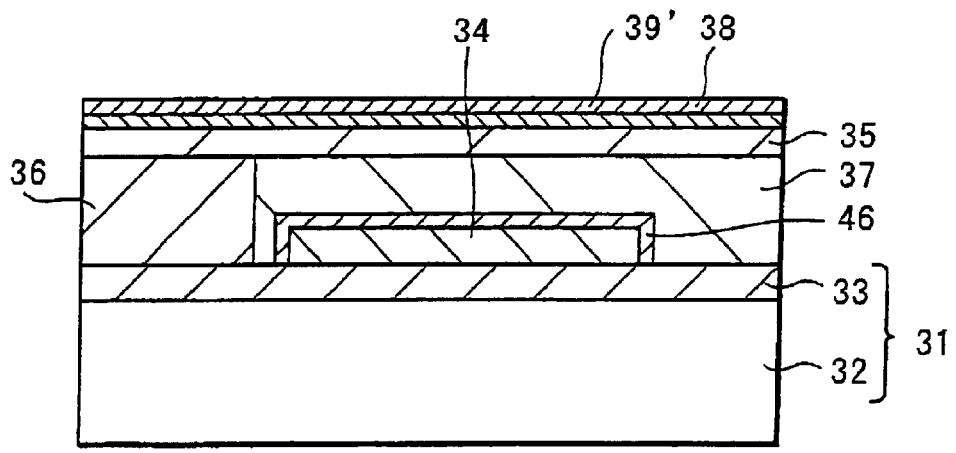

Next, as shown in FIG. 6C, the fluid film 35 with its surface planarized by the same fluidization as mentioned above is formed on the overall surface including the surface of the support part 36 and the polycrystalline silicon layer 37 constituting sacrificial layer. As mentioned above, this fluid layer 35 is formed by using the method in which after an impurities-doped silicate glass film (for example, BSG film, PSG film, PBSG or the like) is formed, anneal treatment is applied thereto, or formed of a silicon film manufactured by the CVD method in which ozone and alkoxysilane are used as materials.

An insulation film such as, for example, silicon nitride film, silicon oxide film or the like, in this embodiment, the silicon nitride film 38 is formed on the fluid film 35, and further the driving side electrode material layer 39', in this embodiment, Al material layer is formed thereupon. FIG. 8A shows an enlarged relevant part thereof. As driving side electrode material layer, the same as was mentioned above, an Ag film, Al film mainly consisting of aluminum (Al) as components, or refractory metal film of such as titanium Ti, tungsten W, molybdenum Mo, tantalum Ta, or the like can be used.

Figure 7A:
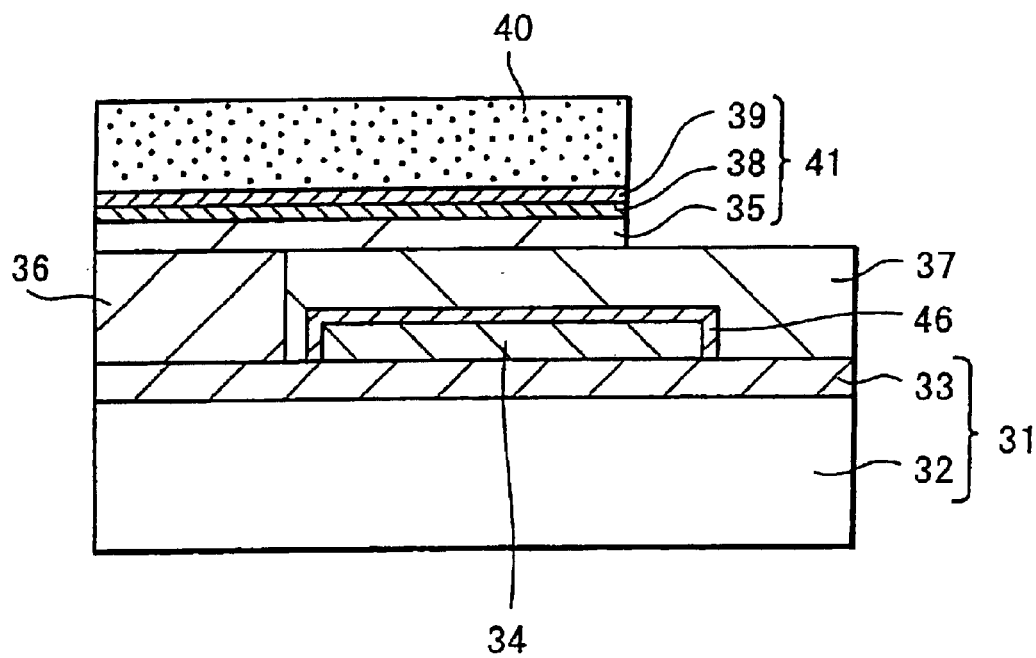
FIGS. 7A and 7B are diagrams of a manufacturing process (second sequence) showing further another embodiment of the manufacturing method of one typical electrostatic drive type MEMS device according to the present invention.

Next, as shown in FIG. 7A, the resist mask 40 is formed, and the driving side electrode material layer 39', and silicon oxide film 38, fluid film 35 thereunder are selectively removed by etching through this resist mask 40 to form the beam 41 composed of the driving side electrode (AL electrode) 39 and silicon nitride film 38, which is supported by the support part 36. In this embodiment, since the fluid film 35 remains, the beam 41 is formed of a three-layer film of the driving side electrode 39, silicon nitride film 38 and fluid film 35.

Figure 7B:
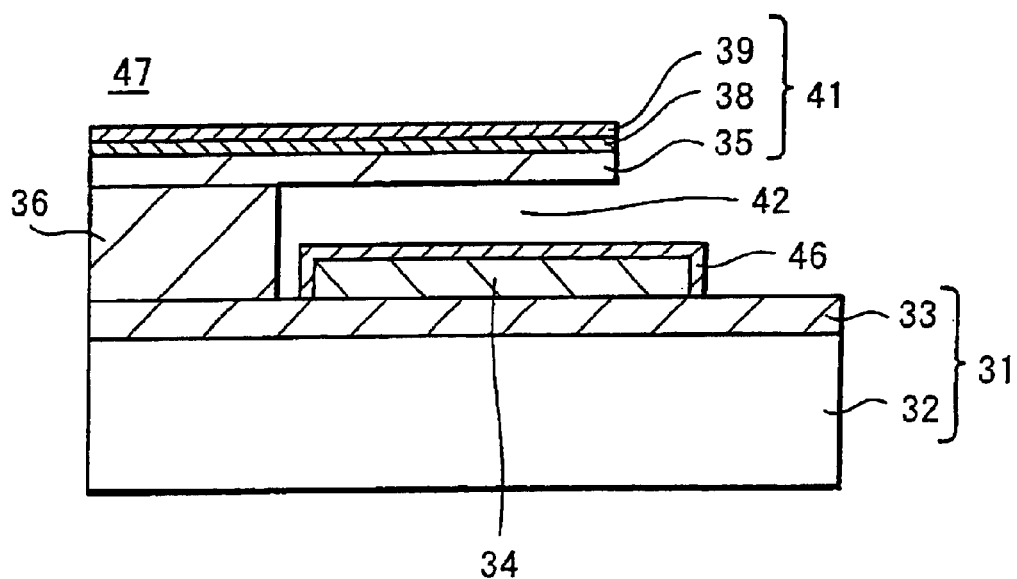
Figure 8B:
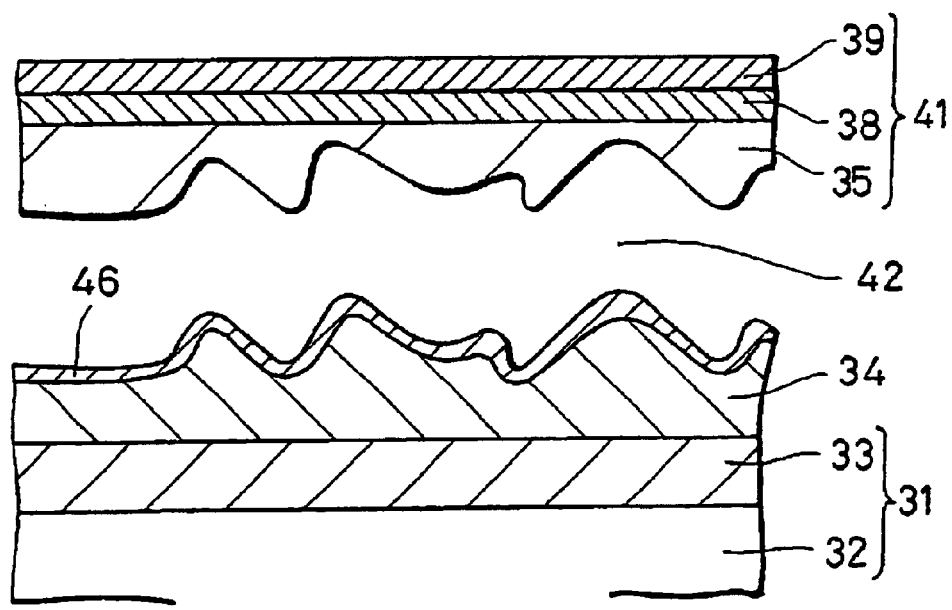
FIG. 8B is an enlarged cross-sectional view of a relevant part of FIG. 5B.

Next, as shown in FIG. 7B, the polycrystalline silicon layer 37 constituting a sacrificial layer is removed. When the sacrificial layer 37 is formed of polycrystalline silicon, it can be easily removed by etching with $XeF_2$ gas, as mentioned above. The void 42 is formed between the substrate side electrode 34 (substantially, protective film 46) and beam 41 by removing the sacrificial layer 37 to obtain the targeted electrostatic drive type MEMS device 47 in which the beam is structured in a cantilever fashion. FIG. 8B shows an enlarged relevant part thereof including the beam 41.

This MEMS device 47 is structured to have the beam 41 which has the planarized surface and planarized reverse surface opposing the fluid film, and is detached from the considerably uneven substrate side electrode 34 (substantially, protective film 46), with the required void 42 therebetween.

The film stress of the fluid layer 35 formed of silicate glass is sufficiently small compared with the silicon nitride film, so that the fluid film 35 on the undersurface of the beam 41 can remain, as is in this embodiment, depending on the state of use. In another case, it is possible to form the beam 41 having a two-layer film of the driving side electrode 39 and silicon nitride film 38 by removing the fluid film 35 using a dilute solution of fluorine oxide, followed by supercritical dehydration.

In the above embodiment, since the substrate side electrode 34 is formed of polycrystalline silicon and the sacrificial layer 37 is formed of silicon, a protective layer 46 serving as an etching stopper is formed on the surface of the substrate side electrode 34, though it is possible to omit this protective layer 46 depending on the material of the sacrificial layer 37.

Here, a conceptual diagram is shown in which the unevenness of the undersurface of the fluid film 35 opposing the substrate side electrode 34 conforms to that of the surface of the insulation film 46 formed on the substrate side electrode 34, because the non-crystalline silicon capable of accurately transcribing underlay unevenness is used as sacrificial layer thin material. However, when polycrystalline silicon, for example, is used as the sacrificial layer thin material, since there occurs grain diameter distribution, the undersurface of the fluid layer 35 may have considerable unevenness.

According to the manufacturing method of the MEMS device of the embodiment, since the fluid layer 35 is formed after the substrate side electrode 34 of polycrystalline silicon, protective film 46, and sacrificial layer 37 are formed, and then on the planarized surface 35a of the fluid layer 35 the silicon nitride film 38 and driving side electrode material layer 39' composing the beam are sequentially formed, the surface of the silicon nitride film 38 and the surface of the driving side electrode material layer 39' are planarized, with the result that the beam 41, the surface of which is planarized, can be obtained.

Therefore, the uniformity of the film of the beam 41 can be obtained to reduce fluctuations in the film shape of the beam, and there are no considerable fluctuations in the physicality value of the beam, with the result that it is possible to obtain the MEMS device in which the whole film of the beam is without any fluctuation. Further, since it is possible to get rid of the unevenness of the surface of the beam 41 and to reduce the fluctuations in the number of vibrations and the like of the beam 41, the uniformity in the performance of the MEMS device can be improved, and the mass-production of the high-quality MEMS device 43 is made possible.

When the MEMS device 47 manufactured according to the embodiment is applied to the optical MEMS device used in, for example, an optical switch, light modulation device or the like, which takes advantage of light reflection or light diffraction, light reflectance on the driving side electrode 39 serving as a light reflective film can be improved and the improvement of light use efficiency as the optical MEMS device can be implemented.

Figure 9A:
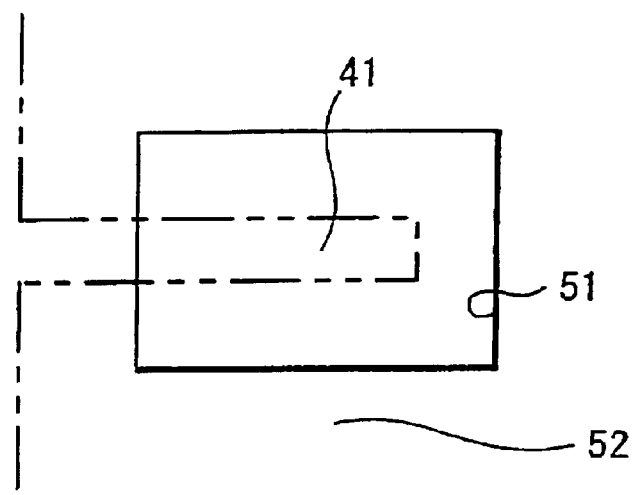
FIG. 9A is a diagram showing a layout of a mask which is applied when a fluid film of the present invention is formed.
Figure 9B:
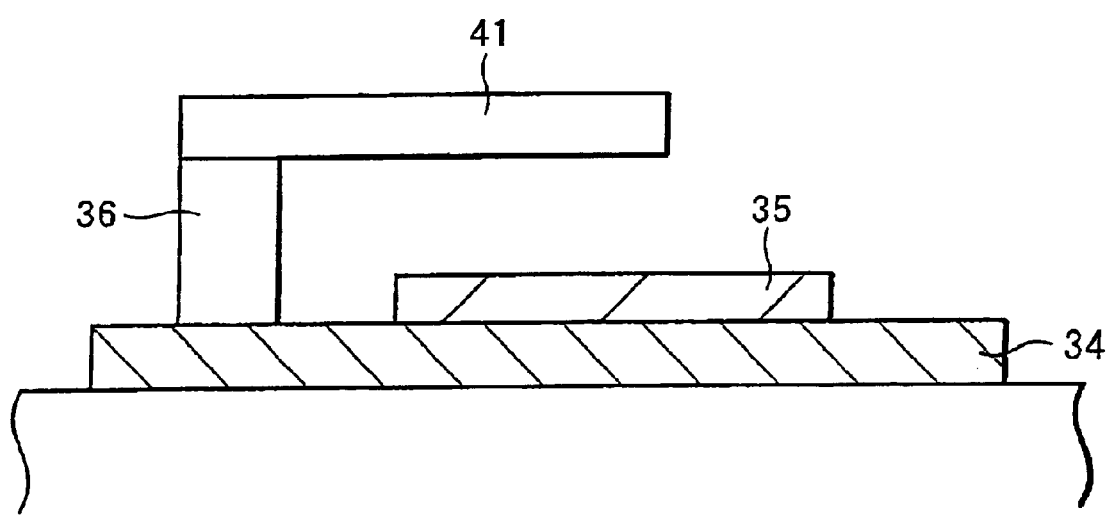
FIG. 9B is a cross-sectional view thereof.

The fluid film 35 is at least required to be formed only under the portion corresponding to the beam 41. Therefore, as shown in FIGS. 9A and 9B, in order to form the fluid layer 35 at the portion corresponding to the beam 41 including the upper part of the substrate side electrode 34, the resist mask 51 is formed. A part 52 is an opening. Using this resist pattern, the cross-sectional structure shown in FIG. 9B can be obtained by etching the fluid film 35 to cover the substrate side electrode 34. Thus, the beam 41 having the driving side electrode 39 with a planarized surface can be obtained.

Figure 12:
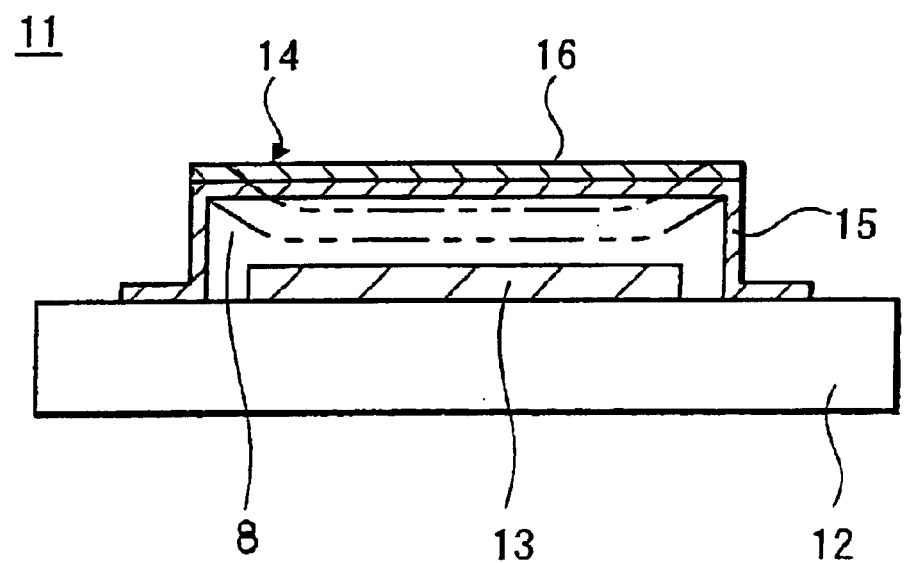
FIG. 12 is another typical example of the optical MEMS device for explaining a conventional one.
Figure 13A:
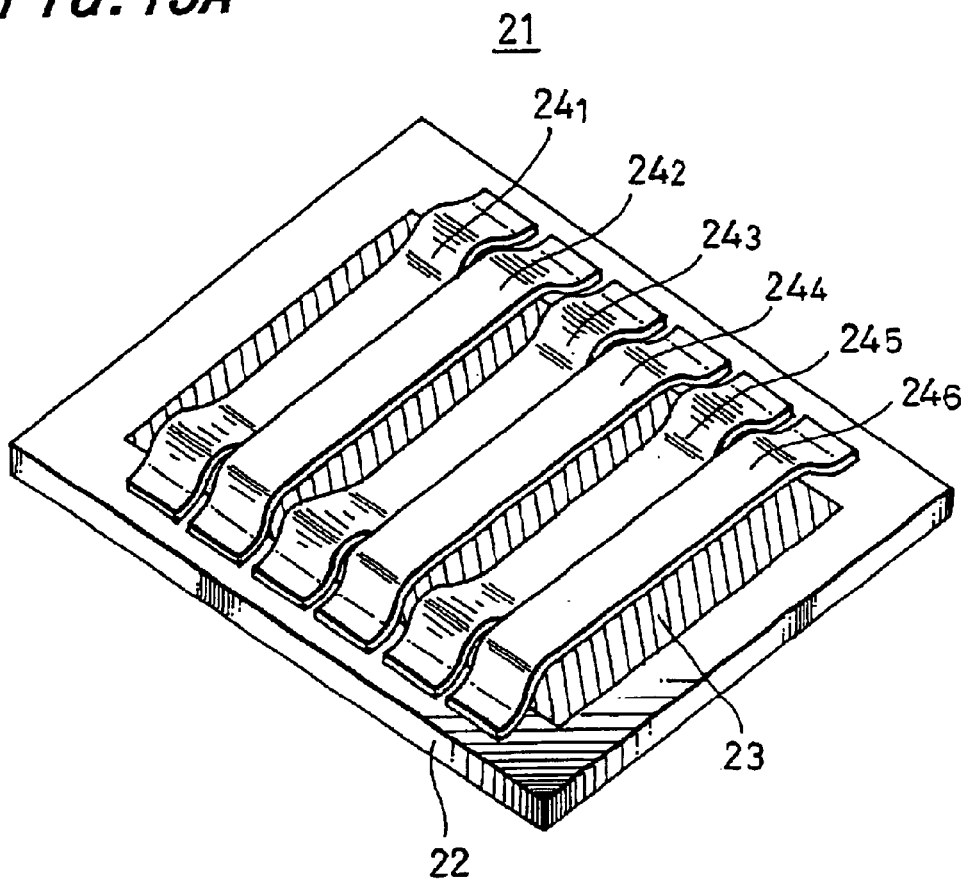
FIG. 13A is a structural diagram showing a conventional GLV device.
Figure 13B:
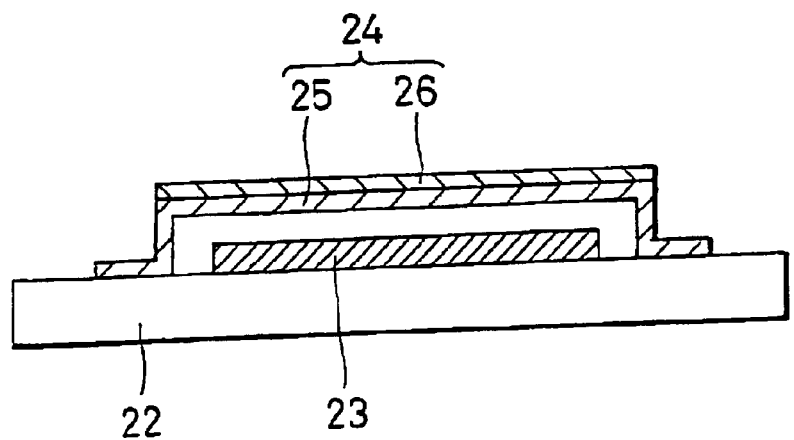
FIG. 13B is a cross-sectional view thereof.
Figure 14A:
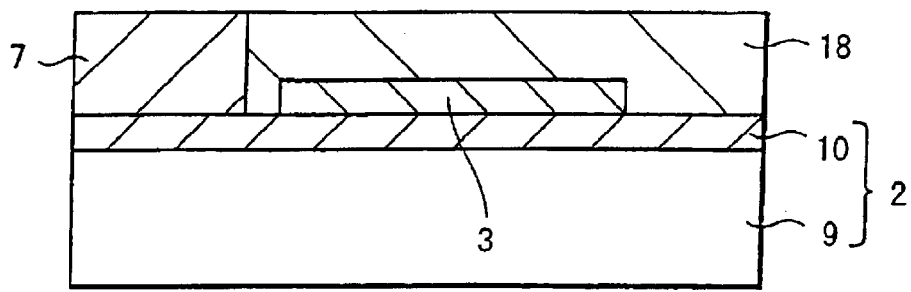
FIGS. 14A to 14D are diagrams of a manufacturing process showing a manufacturing method of a conventional electrostatic drive type MEMS device.
Figure 14B:
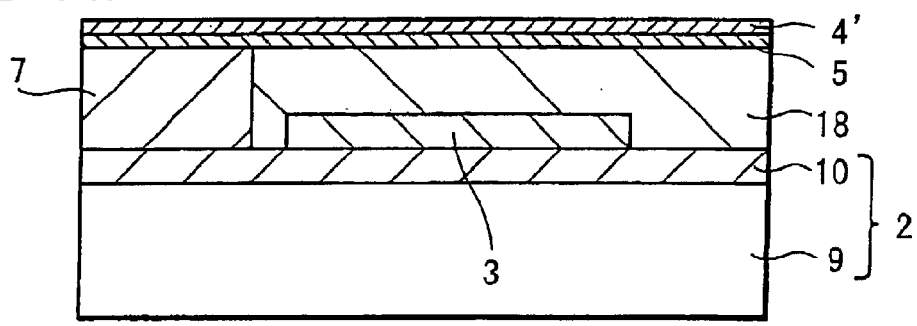
Figure 14C:
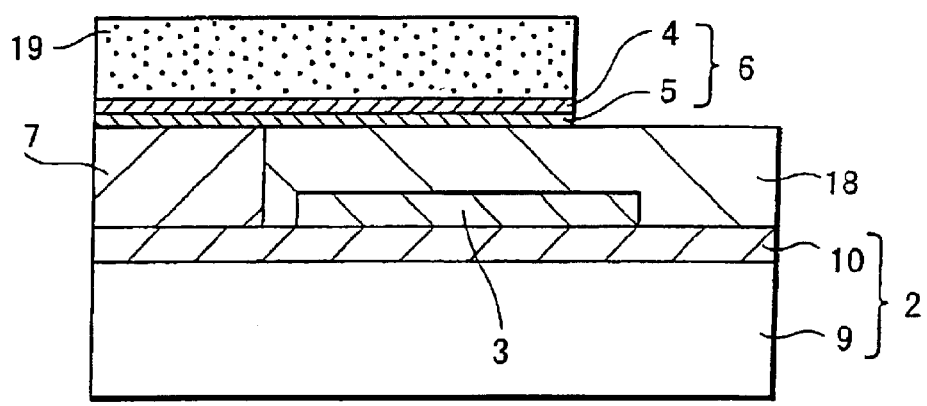
Figure 14D:
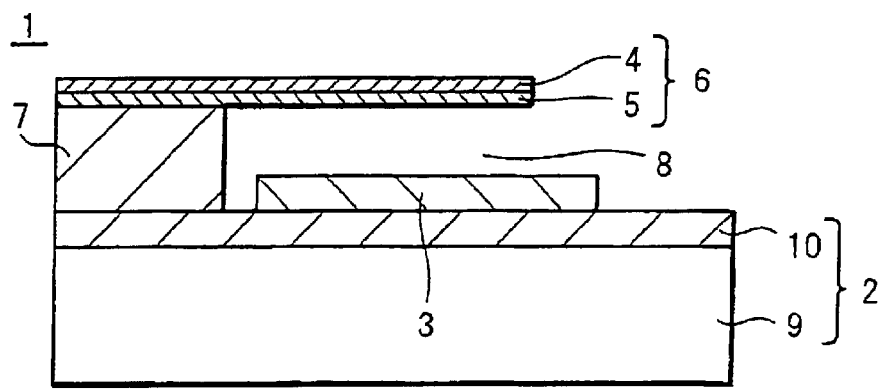
Figure 15:
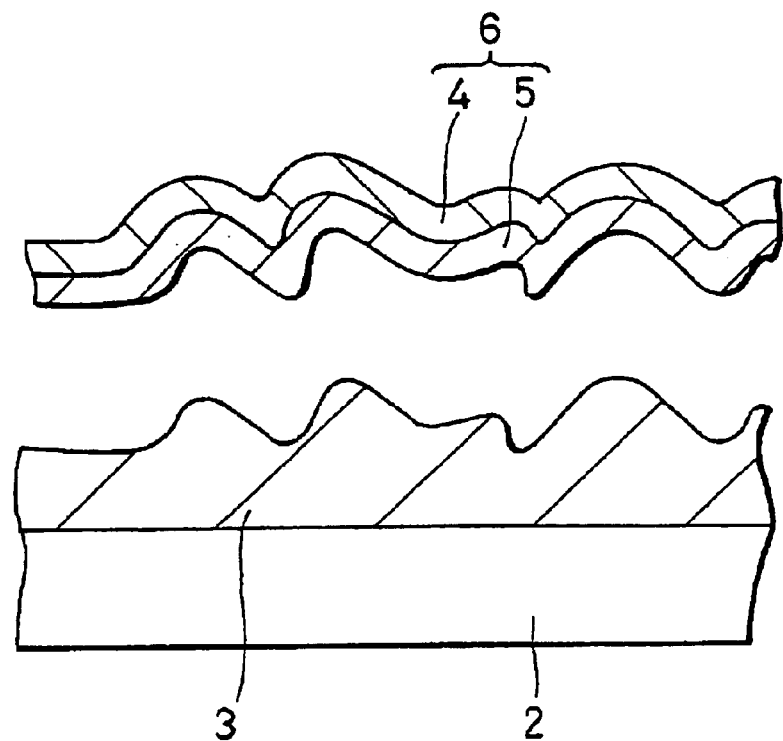
FIG. 15 is a cross-sectional view of a relevant part of a conventional optical MEMS device, showing the unevenness of a driving side electrode thereof.
Figure 16:
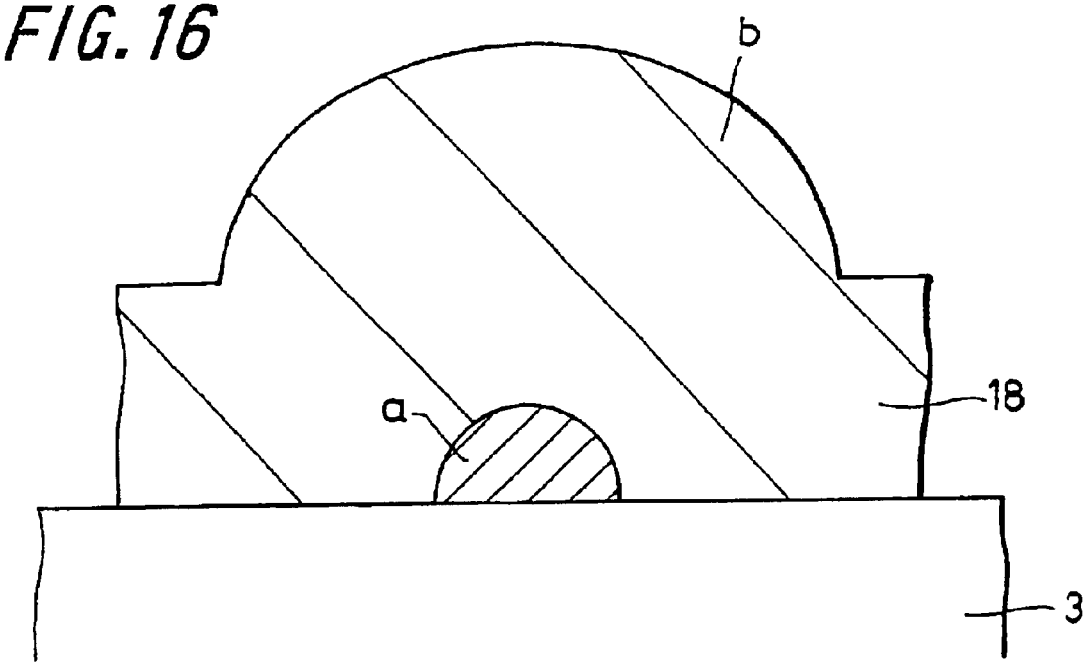
FIG. 16 is an explanatory diagram of a state in which the unevenness of underlaid layer is expanded and transcribed to an upper layer.
Figure 17:
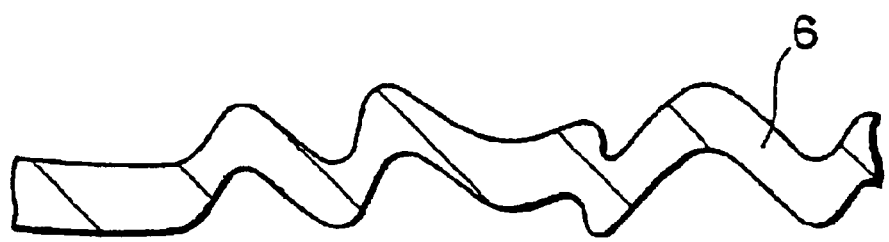
FIG. 17 is a cross-sectional diagram showing the shape of a film constituting a beam obtained by a conventional manufacturing method.
Figure 18:
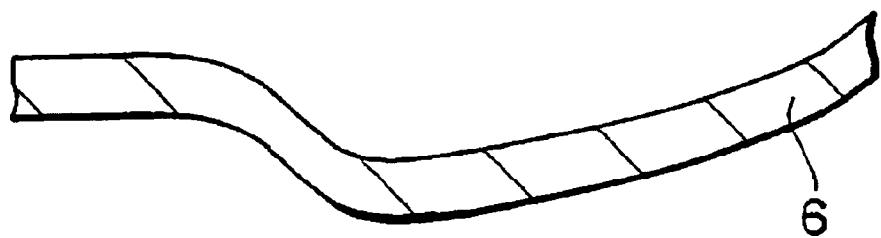
FIG. 18 is a cross-sectional diagram showing the shape of a film constituting a beam obtained by the conventional manufacturing method.

The above-mentioned embodiment has been applied to manufacturing the MEMS device in which the beam is of a cantilever type, though it can be applied to manufacturing another MEMS device in which the beam is of a bridge type as shown in FIG. 12.

FIGS. 10A to 10D are the case in which a manufacturing method of the present invention is applied to manufacturing a MEMS device of a double-cantilever type. This embodiment is the case in which the processes of FIGS. 1 and 2 are applied to manufacturing the MEMS device.

Figure 10A:
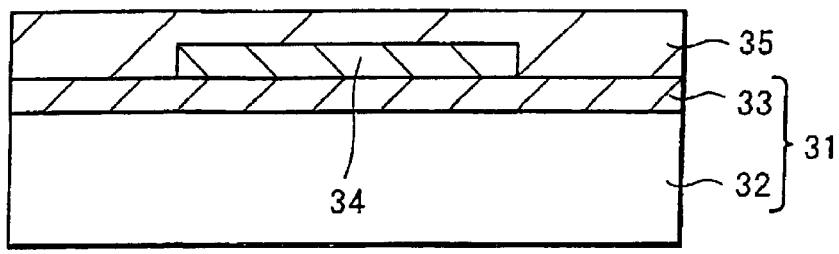
FIGS. 10A to 10D are diagrams of a manufacturing process showing one embodiment of a manufacturing method of another typical electrostatic drive type MEMS device according to the present invention.

First, as shown in FIG. 10A, the substrate side electrode 34 of, for example, polycrystalline silicon is formed on a substrate, in this embodiment, the substrate 31 consisting of the insulation film 33 formed on the semiconductor substrate 32. Next, the fluid film 35 with its surface planarized by the above-mentioned same fluidization is formed on the substrate 31 including the substrate side electrode 34.

Figure 10B:
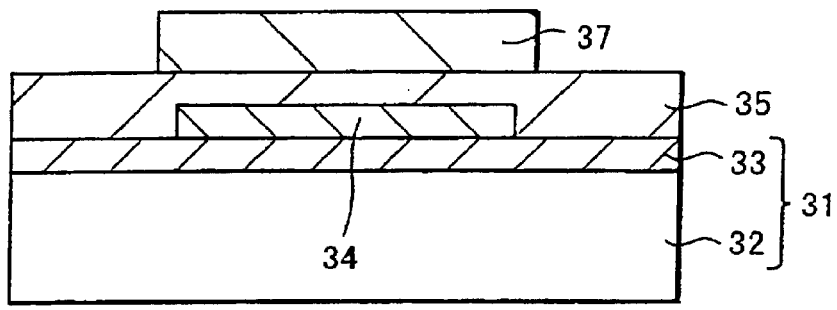

Next, as shown in FIG. 10B, the sacrificial layer 37 for forming a void is selectively formed on the planarized fluid film 35 at a position corresponding to the position of the substrate side electrode 34.

Figure 10C:
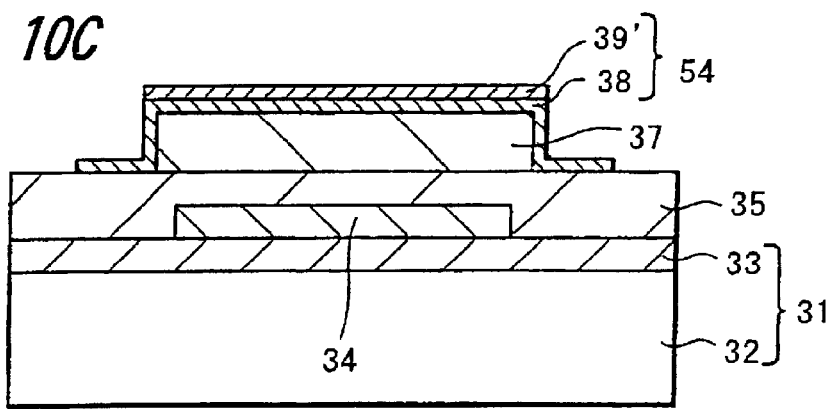

Next, as shown in FIG. 10C, an insulation film of, for example, the silicon nitride film 38 and the driving side electrode material 39' of, for example, an Al film are sequentially formed on the sacrificial layer 37 including over the planarized fluid film 35, and a beam 54 of the double-cantilever type consisting of the driving side electrode 36 and silicon nitride film 38 serving thereunder as a bridge is formed by patterning.

Figure 10D:
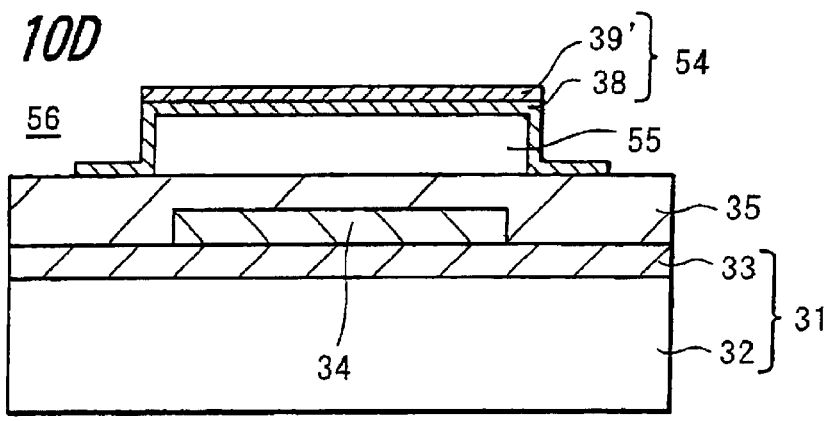
Figure 11:
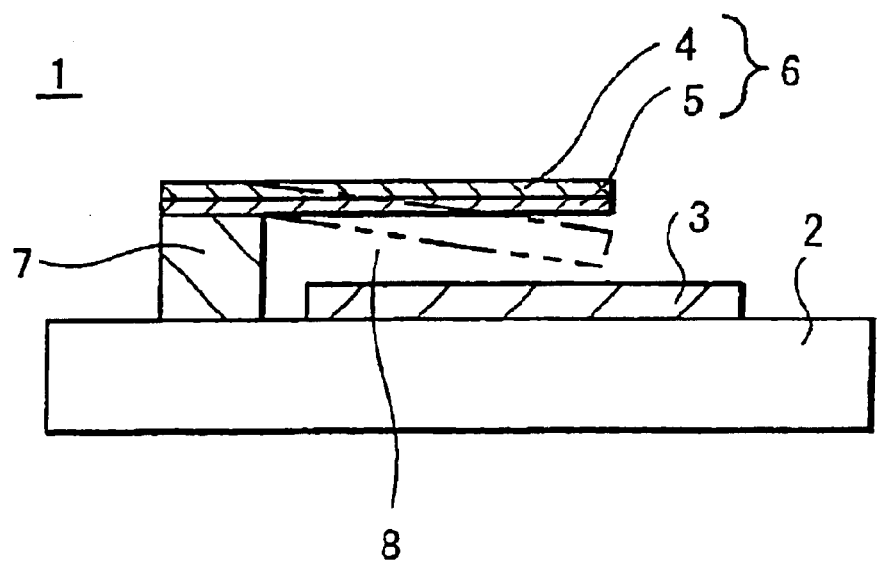
FIG. 11 is a typical example of an optical MEMS device for explaining a conventional one.

Next, as shown in FIG. 10D, the sacrificial layer 37 is removed to form a void 55 between the substrate side electrode (substantially, fluid film) 34 and beam 54, with the result that a targeted electrostatic drive type MEMS device in which the beam is formed in a bridge-like fashion can be obtained.

Further, though not shown in the figures, the MEMS device of the double-cantilever type can be manufactured by using the processes of FIGS. 6 and 7.

As with the manufacturing method shown in FIG. 10, similar effectiveness to those of the above-mentioned embodiments can be obtained.

The manufacturing method of the present invention can be applied to manufacturing the above-mentioned GLV device 21, though not shown in the figures

What is claimed is:

1. A manufacturing method of a MEMS device, comprising the steps of:

forming a substrate side electrode on a substrate;

forming a support member detached from said substrate side electrode on said substrate;

forming a sacrificial layer on said substrate side electrode so that said sacrificial layer and said support member form a continuous surface;

forming a fluid film on said continuous surface;

forming a driving side electrode on said fluid film; and removing said sacrificial layer so that said driving side electrode and said fluid film form a planarized beam, wherein said fluid film is a silicate glass formed of a silicate glass film including phosphor, boron, or the both, and after forming the silicate glass film by heat treatment, planarizing a surface of said silicate glass film.

2. A manufacturing method of a MEMS device, comprising the steps of:

forming a substrate side electrode on a substrate;

forming a support member on said substrate;

forming a sacrificial layer on said substrate side electrode and adjacent to said support member;

forming a fluid film on said sacrificial layer and said support member;

forming a driving side electrode on said fluid film; and removing said sacrificial layer so that said driving side electrode and said fluid film form a planarized beam, wherein said fluid film is a silicate glass formed of a silicate glass film including phosphor, boron, or the both, and after forming the silicate glass film by heat treatment, planarizing a surface of said silicate glass film.

* * * * *